United States Patent [19]

Roth et al.

[11] 4,267,725

[45] May 19, 1981

[54] ARRANGEMENT FOR REGISTERING LOADS

[76] Inventors: Jac M. Roth; Veronika Roth nee Werner, both of Sandbuechel 26a, D-506 Bensberg-Refrath, Fed. Rep. of Germany

[21] Appl. No.: 41,517

[22] Filed: May 22, 1979

[51] Int. Cl.³ .......................... G01L 1/22; G01D 1/18
[52] U.S. Cl. .............................. 73/862.65; 200/67 DB
[58] Field of Search ...................... 73/141 A, 774, 763; 200/67 DB; 338/2, 5, 47

[56] References Cited

U.S. PATENT DOCUMENTS

| 2,666,262 | 1/1954 | Ruge | 73/141 A X |
| 3,164,014 | 1/1965 | Redner | 73/141 A |
| 3,246,511 | 4/1966 | Abel | 73/141 A |
| 3,364,451 | 1/1968 | Paul et al. | 338/47 |
| 3,572,110 | 3/1971 | James et al. | 73/144 |
| 3,873,078 | 3/1975 | Wolf | 200/67 DB |
| 4,190,751 | 2/1980 | Roth et al. | 200/67 DB |

Primary Examiner—Charles A. Ruehl
Attorney, Agent, or Firm—Michael J. Striker

[57] ABSTRACT

An arrangement for registering loads includes an elongated transversely flexible element having two end portions and an intermediate portion therebetween. The end portions are rigidly fastened so as to preclude all lateral movement of the end portions. A compressive force is directed lengthwise of the element and towards the center thereof so that the intermediate portion suddenly flexes laterally when this force exceeds a predetermined limit. Strain gauges are mounted on the elongated element. The strain gauges become stressed when the intermediate portion flexes. The strain gauges generate a signal in response to stressing due to the flexing of the intermediate portion.

8 Claims, 3 Drawing Figures

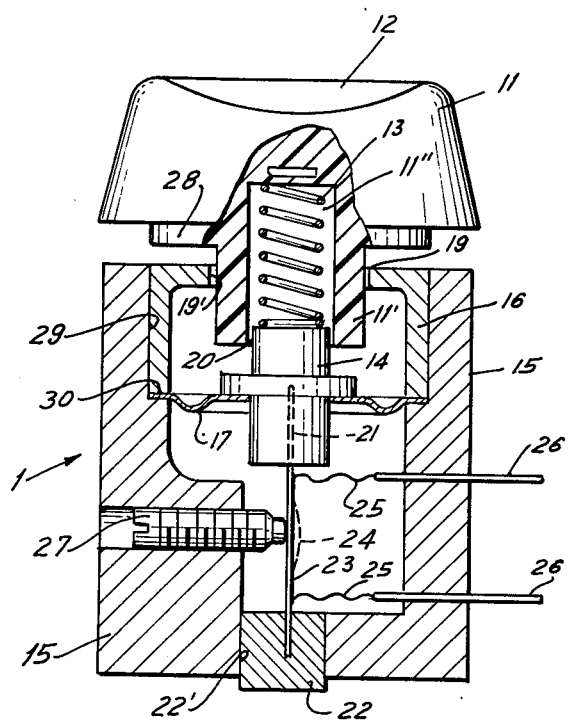
FIG. 1
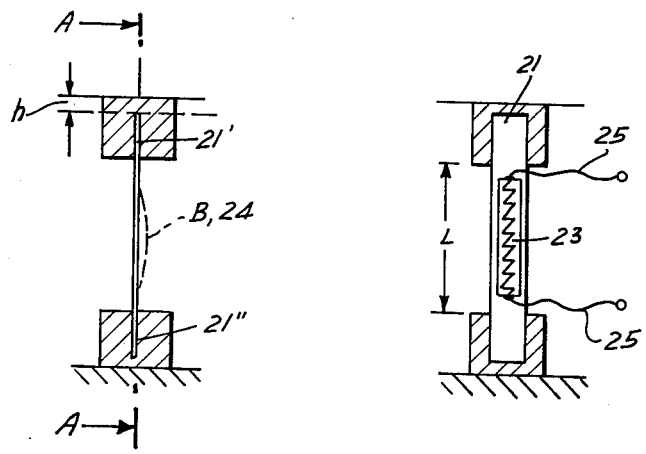
FIG. 2
FIG. 3

ARRANGEMENT FOR REGISTERING LOADS

BACKGROUND OF THE INVENTION

The present invention relates to switches.

It is known to provide switches operating on an inductive or capacitive basis, e.g., magnetic-field responsive switches operating on the basis of the Hall effect, switches of the electric-eye type, and switches incorporating piezoelectric crystals.

The main common feature of such switches resides in the fact that they have to be responsive (i.e. actuated) even when the actuating force is extremely small. Moreover, it is very important for the switches of the above-mentioned systems and the like to be entirely free of any chattering (i.e. vibrating) so as not to influence the switching action of the switches.

Such switches are usually actuated manually, that is an operator presses a push button by a finger. It has been recongized that the switching signal (i.e. action) of such a switch depends in a direct proportion on an actuating movement of (or on actuating pressure on) the push button Therefore, the switching action has a relatively low gradient of increase (i.e. steepness). However, it is very often desirable, that the switch be operated even at a slight pressing (i.e. actuating) force on or an extremely small actuating movement of the push button. Moreover, such switches require substantial preparation expenses.

Systems which avoid these disadvantages, such as opto-electro-mechanic systems, are extremely expensive in manufacturing.

On the other hand, these systems include a great number of electric parts which obviously increase (i.e. in a direct proportion) the chances of malfunction of the systems. Needless to say, the more complicated the construction of the systems in general and the switches in particular, the greater the number of significant problems and difficulties encountered during the process of manufacturing of these systems and the switches therefore.

SUMMARY OF THE INVENTION

It is a general object of the present invention to avoid the disadvantages of the prior art switches.

More particularly, it is an object of the present invention to provide a switch which has a switching movement which increases not in a direct proportion in response to an increase of the actuating pressure on or movement of a push button of this switch.

Another object of the present invention is to provide a switch of a simple and still reliable construction.

Still another object of the present invention is to provide a switch, which comprises comparatively fewer parts.

Yet another object of the present invention is to provide a switch which is operative in response to even extremely small actuating forces on, and actuating movement of, a push button of the switch.

In pursuance of these objects and others which will become apparent hereafter, one feature of the present invention resides in providing an arrangement for registering loads, comprising an elongated transversely flexible element having two end portions and an intermediate portion therebetween and means for rigidly fastening the end portions of said element so as to preclude all lateral movement of said end portion. A compressive force is directed lengthwise of said element and towards the center thereof so that said intermediate portion suddenly flexes laterally when said force exceeds a predetermined limit.

One of the main advantageous features of the present invention resides in operating means mounted on said element so as to be stressed when said intermediate portion flexes. The operating means generate a signal in response to stressing thereof due to the flexing of the intermediate portion.

The operating means may be in form of strain gauges which are rigidly mounted an (e.g., glued to) the elongated element at the intermediate portion thereof. Such strain guages are known, for example, from German Pat. No. 2,547,257. The strain gauges do not act in linear (i.e. direct) function of the compressing force applied onto (or the actuating movement of) the switch. Moreover, the gradient of the stresses on the strain gauges is significantly increased and has a substantial steepness. Obviously, the electric resistance of the strain gauges changes in a sudden manner once the strain gauges are stressed even slightly.

Since both ends of the elongated transversely flexible element (e.g. a leaf spring) are fastened so as to prevent any lateral movement of these ends, there is no need to readjust the element during the service life thereof. It is especially advantageous if compared with the prior art switches in which the ends of the respective elongated elements can move laterally and therefore affect the precision and effectiveness of the switch in general. In the case of the prior art switches, one has after a short time of use to readjust the elongated element so as at least partially compensate for the changes which occur in the switch during using and aging thereof. It is especially true in the case of so-called knife-edge suspensions.

Even an extremely small actuating movement (i.e. actuating force) results, in the case of the present invention, in a steep stress development in the strain gauges which takes place once the intermediate portion of the elongated element flexes. Moreover, the electric signal generated by the strain gauges is significantly strong. Therefore, no additional electric device for amplifying this signal is required. In other words, the signal generated by the strain gauges in response to stressing thereof may be directly transmitted for further processing, for example, switching off or on of an element to be operated.

The permanent position of the elongated element and the flexing movement of the intermediate portion of the same ensure an adequate precision of the repeated signals generated by the strain gauges. This is true, since the elongated element of the present invention is subjected only to inside friction of the flexible material of the element.

In this context, it is to be understood that in the case of the prior art switches (having the ends of the flexible element free to move laterally), the ends (or at least one end) of the element are exposed to a number of external factors, such as a non-constant outer friction between the free ends of the element and a respective supporting surface which is especially true in the case of a dirt-development on the free ends and/or on the supporting surface, unpredictable, and therefore, uncontrollable wear (i.e. abrasion) of the ends of the element and/or the supporting surface. Moreover, it is necessary even after a short time of use of the switch to readjust the free ends of the flexible element relative to the supporting surface. Needless to say, that any readjustment of the flexible element has a certain (even if a small) inaccuracy. Obviously, any of these external factors negatively affect the precision of the switch in general and the flexible element in particular. However, in the case of the present invention, any influence of the external factors on the flexible element are precluded.

The intermediate portion of the elongated element flexes (i.e. bends) forming substantially a cosine function curve which may be described by y=a·cos wx.

The actuating movement (A) and the length (B) of the flexed intermediate portion may be defined as follows:

h=B−L
B  y=a·cos wx
B=∫√1+(y')²·dx
wherein
  h—is a stroke of the actuating movement;
  B—is the length of the intermediate portion of the elongated element in a flexed position;
  L—is the length of the intermediate portion of the elongated element in a straight (i.e. unflexed) position;
  w—is the number of oscillations per second, w=π/L wherein π=3, 14 . . .
  x—is an independent variable;
  a—is the amplitude of oscillations;
  y—is a dependent variable; and
  y'—is a derivative of the function dy/dx However, it is to be understood that the above-discussed relationship is not a decisive factor in a measuring technique. This fact, obviously, considerably facilitates the process of mass production and use of the switches according to the present invention with different electric devices.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWING

FIG. 1 is a sectional view of an arrangement according to the present invention;

FIG. 2 is a schematic view of an elongated transversely flexible element;

FIG. 3 is a schematic view of the elongated element as seen in direction of arrow A in FIG. 2.

DESCRIPTION OF PREFERRED EMBODIMENTS

Referring now to the drawing and first to FIG. 1 thereof, it may be seen that the reference numeral 1 designates in toto a switch. The switch 1 includes a hollow housing 15 and push button 11 movable relative to the housing 15 between an idle and an operative position.

The push button 11 is operative manually. For this purpose an upper surface of the push button 11 is provided with a rounded depression for accommodating therein a finger of an operator's hand.

The push button 11 is provided with a portion 11' which projects towards and into an interior of the housing 15 through a hole 19'. The lower surface of the push botton 11 is further provided with a projection 28 which abuts an upper end face 19 of the housing 15 when the push button is pressed all the way in the housing 15.

The portion 11' of the push button 11 is provided with a recess 11" which is open downwardly, i.e. into an interior of the housing 15.

The upper portion of the housing 15 is provided with a circumferential inner recess 29 forming an inner shoulder 30. A diaphragm 17 is mounted inside the housing 15 so that an outer circumferential edge of the diaphragm 17 is supported by the shoulder 30.

A cup-shaped sleeve 16 is pressed upside down into the housing 15 along the recess 29 thereof so as to fixedly locate the outer circumferential edge of the diaphragm 17 against the shoulder 30. The hole 19 is provided in the cup-shaped sleeve 16.

A pressing nipple 14 is rigidly supported (i.e. glued) on the upper surface of the diaphragm 17. The pressing nipple 14 has an upper projection which at least partially extends into the recess 11" of the push button 11. The pressing nipple 14 may be made of synthetic plastic material.

A compressing spring 13 is located inside the recess 11" so that one end of the spring 13 abuts the closed end of the recess 11" whereas the other end of the spring 13 is supported on the upper projection of the pressing nipple 14.

A lower portion of the housing 15 is provided with a hole 22' which is closed by a plug 22.

The pressing nipple 14 has a lower projection which extends in the interior of the housing 15 below the diaphragm 17.

A normally straight leaf spring 21 is located inside the housing 15. The leaf spring 21 has an upper end 21' which is rigidly embraced by (i.e. pressed in) the lower projection of the pressing nipple 14, whereas a lower end 21" of the leaf spring 21 is rigidly embraced by (i.e. pressed in) the plug 22. It is to be understood that the ends 21' and 21" of the leaf spring 21 are so fixed that any lateral movement of these ends respectively is precluded (i.e. eliminated).

Thus, when the operator presses the push button 11 downwardly into the housing 15 he or she has to overcome the biasing force of the spring 13 (which normally urges the push button 11 away from the housing 15) and the biasing force to the normally straight spring 21.

When the biasing force of both springs 13 and 21 is overcome the leaf spring 21 flexes (i.e. bends) at the intermediate portion thereof laterally relative to the vertical elongation of the leaf spring 21.

A support 27 abuts the leaf spring 21 at one side surface thereof so as to ensure that the leaf spring 21 flexes only in one direction, that is away from the support 27.

In a preferred embodiment of the present invention, the support 27 is formed as a set screw (i.e. adjustment screw). Thus, it is possible to adjust the leaf spring 21 so as to ensure that the latter extends straight in a normal (unstressed) position thereof.

The other surface of the leaf spring 21 is provided with strain gauges 23 (see FIGS. 1 and 3) which are connected via flexible wires 25 to connecting terminals 26 which extend through a respective wall of the housing 15 outwardly beyond thereof. The strain gauges may be glued or otherwise rigidly connected to the leaf spring 21.

It is preferable to use flexible stranded fibers, for the wires 25.

Thus, then the intermediate portion (i.e. having a length L) flexes the strain gauges are immediately stressed and therefore the electrical resistance of the strain gauges changes correspondingly and a respective electrical signal is transmitted through the wires 25 to the terminals 26 for further processing.

In a flexed position (see FIGS. 1 and 2) the intermediate portion of the leaf spring 21 has a length B. The flexed portion of the leaf spring 21 is designated by the reference numeral 24.

The length B of the flexed intermediate portion of the leaf spring exceeds the length L of the straight intermediate portion by the distance h. In other words, the pressing nipple 14 has to move downwardly by a distance h in order to increase the length of the intermediate portion of the leaf spring from the normal L value (i.e. in the unstressed position of the leaf spring) to the operating value B when the spring leaf is flexed.

When the operator releases the push button 11, the latter is returned into the initial position due to the inherent tendency of the springs 13 and 21, to return to the uncompressed condition. The leaf spring 21 moves to its unstressed position until it abuts the setscrew 27.

The leaf spring 21 may be of synthetic plastic material reinforced by glass fibers.

It is to be understood that when the push button 11 moves downwardly overcoming the biasing force of the spring 13 the pressing nipple moves also downwardly causing the diaphragm 17 (which is of elastomeric expandable material) to expand downwardly.

When the leaf spring 21 moves back into its initial unstressed (i.e. straight) position the pressing nipple 14 moves also back, that is upwardly. Thus, the diaphragm 17 displaces upwardly together with the pressing nipple 14 in an unfolded position shown in FIG. 1.

It is to be understood in this context that the diaphragm 17 may be replaced by any other supporting element. In other words, the only purpose of the supporting element (e.g. diaphragm 17) is to support the pressing nipple 14 to permit the latter to move up and down in the housing 15.

It will be understood that each of the elements described above, or two or more together, may also find a useful application in other types of a load-registering arrangement differing from the types described above.

While the invention has been illustrated and described as embodied in a load-registering arrangement it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, form the standpoint of prior art, fairly constitute essential characteristics of the generic or specific aspects of this invention.

What is claimed as new and desired to be protected by Letters Patent is set forth in the appended claims:

1. An arrangement for registering loads comprising an elongated transversely flexible element having two end portions and an intermediate portion therebetween; fastening means for rigidly fastening said end portions, said fastening means including a laterally immovable pressing nipple rigidly embracing one of said end portions; means for applying a compressive force lengthwise of said elongated element and towards the center thereof, said pressing nipple being operatively connected to said compressive force applying means; supporting means for supporting said pressing nipple adapted to permit the same to move longitudinally in the direction of elongation of said elongated element and to prevent any lateral movement of said pressing nipple in the direction transversal to said elongation; and operating means mounted on said elongated element and operative for generating a signal due to stressing of said operating means, whereby when the compressive force applied to said elongated elements exceeds a predetermined limit said intermediate portion flexes laterally so that said operating means are stressed and a signal corresponding to flexing of said intermediate portion is generated.

2. An arrangement as defined in claim 1, wherein said elongated element is a spring.

3. An arrangement as defined in claim 1, wherein said elongated element is a leaf spring.

4. An arrangement as defined in claim 1, wherein said operating means include strain gauges fixedly connected to said elongated element and having a predetermined electric resistance.

5. An arrangement as defined in claim 4, wherein said operating means further include electric means connected to said strain gauges so that once the strain gauges are stressed the electric resistance thereof changes to thereby generate an electric signal corresponding to the stress on the strain gauges.

6. An arrangement as defined in claim 1, wherein said elongated element is of synthetic plastic material.

7. An arrangement as defined in claim 6, wherein said synthetic plastic material is reinforced by glass fibers.

8. An arrangement as defined in claim 1, wherein said supporting means include a diaphragm rigidly connected to said pressing nipple.

* * * * *